United States Patent
Ivanov et al.

(10) Patent No.: US 6,642,789 B2
(45) Date of Patent: Nov. 4, 2003

(54) OPERATIONAL AMPLIFIER INPUT STAGE AND METHOD

(75) Inventors: Vadim V. Ivanov, Tucson, AZ (US); Wally Meinel, Tucson, AZ (US); Junlin Zhou, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/094,540

(22) Filed: Mar. 8, 2002

(65) Prior Publication Data

US 2003/0169111 A1 Sep. 11, 2003

(51) Int. Cl.[7] ................................................ H03F 3/45
(52) U.S. Cl. ........................ 330/253; 330/258; 330/261
(58) Field of Search ................................. 330/253, 258, 330/261, 252; 327/359

(56) References Cited

U.S. PATENT DOCUMENTS

| | | | |
|---|---|---|---|
| 4,333,058 A | | 6/1982 | Hoover |
| 4,357,578 A | | 11/1982 | Yokoyama |
| 4,377,789 A | | 3/1983 | Hoover |
| 4,532,479 A | | 7/1985 | Blauschild |
| 4,555,673 A | | 11/1985 | Huijsing et al. |
| 5,128,630 A | * | 7/1992 | Mijuskovic ................. 330/253 |
| 5,311,145 A | | 5/1994 | Huijsing et al. |
| 5,371,419 A | | 12/1994 | Sundby |
| 5,500,624 A | | 3/1996 | Anderson |
| 5,550,510 A | | 8/1996 | Nagaraj |
| 5,587,687 A | * | 12/1996 | Adams ...................... 330/253 |
| 5,777,514 A | | 7/1998 | Mittal et al. |
| 5,808,513 A | | 9/1998 | Archer |
| 5,844,434 A | | 12/1998 | Eschauzier |
| 5,929,705 A | | 7/1999 | Zhang et al. |
| 6,043,708 A | | 3/2000 | Barr |
| 6,150,883 A | | 11/2000 | Ivanov |
| 6,166,592 A | | 12/2000 | Walden |

OTHER PUBLICATIONS

Ultra–low Voltage CMOS Cascode Amplifier Torsten Hehmann and Marco Cassia, Department of Information Technology, Building 344, Orsteds Plads, Technical University of Denmark, DK–2800 Kgs. Lyngsby, Denmark tl@it.dtu.dk.

* cited by examiner

*Primary Examiner*—Henry Choe
(74) *Attorney, Agent, or Firm*—W. Daniel Swayze, Jr.; W. James Brady; Frederick J. Telecky, Jr.

(57) ABSTRACT

A precision operational amplifier operating in single supply mode, including a single differential transistor input pair and a cascoded CMOS transistor pair, stabilizes the drain-to-source voltage of the input transistor pair to ensure a stable off-set voltage and increased power supply and common mode rejection. The precision amplifier biases the cascoded CMOS transistor pair in accordance with the stabilized drain-to-source voltage of the differential transistor input pair. Such biasing may take the form of body biasing or biasing the gates of the cascode CMOS transistor pair to ensure that the CMOS transistor pair remain in the active region of operation when the common mode supply voltage approaches zero.

15 Claims, 7 Drawing Sheets

OPERATIONAL AMPLIFIER INPUT STAGE AND METHOD

FIELD OF THE INVENTION

The present invention relates to operational amplifiers, and more particularly to an operational amplifier with a differential transistor input stage.

BACKGROUND OF THE INVENTION

In many areas of the electronics industry, such as the portable electronics industry, designers are increasingly using electronic systems requiring lower operating voltages. This enables electronic circuit designers to design systems with smaller power supplies, which in turn reduces product weight and size, and increases the life expectancy of the system DC power supply.

To accommodate the lower operating voltages, electronic circuit designers may typically design electronic circuits using a differential input stage (e.g. differential amplifier). The input stage of the differential amplifier may be coupled to an upper and lower supply rail, where the input stage may further include one or more differential transistor pairs with associated current sources. In addition, the input stage may typically include a common mode input voltage which defines the voltage range within which the input stage of the differential amplifier operates. The common mode input voltage may typically be measured between the upper, or lower, rail of the input stage and the gate node or base node of one transistor of the transistor pair.

FIG. 1 shows an example of a conventional common mode range differential amplifier 10, as described in U.S. Pat. No. 6,150,883 issued Nov. 21, 2000, to Ivanov. Ivanov discloses a differential amplifier including a differential input stage with differentially coupled first 13 and second 14 transistors, and differentially coupled third 17 and fourth 18 transistors.

As shown in FIG. 1, the input stage of amplifier 10 includes a current source 20 that outputs a tail current $I_T$ to the differential transistor pair given by transistors 17 and 18. The drains of transistors 13 and 14 are coupled to a first cascode circuit given by transistors 25 and 26. Similarly, the drains of transistors 17 and 18 are coupled to a second cascode circuit given by transistors 36 and 37. In this arrangement, amplifier 10 may vary the magnitude of the currents provided by transistors 17 and 18 in response to the voltage difference provided by differential voltage input $V_{IN+}$ and $V_{IN-}$.

One problem inherent in the conventional differential amplifier designs, such as that disclosed in the Ivanov patent, however, results from the fabrication process of the input stage transistors. In particular, due to the manufacturing tolerances, the input transistors may not be identically manufactured. This, in turn, may lead to transistors with differing transistor operation (e.g. mismatched transistors), though such differing operation is unintended. The mismatched transistor operation may affect the overall amplifier accuracy by contributing to errors in the input stage common mode rejection. Alternatively, the mismatched transistor operation may lead to a lower common mode rejection and/or lower voltage gain of the input stage than is desired.

The detrimental affects caused by the mismatched transistor operation may deteriorate the common mode rejection of the amplifier due to instability of the source-to-drain voltage and the source-to-body voltages of the differently manufactured input transistors. In addition, the unstable source-to-drain and source-to-body voltages may lead to an input stage with low-voltage gain. The low-voltage gain of the input stage may affect the voltage offset of any amplifier stage following the input stage, and subsequently may affect the overall voltage offset of the entire amplifier system. For example, the common mode rejection of an operational amplifier using CMOS transistors, such as that didsclosed in the Ivanov patent, may be limited to about 75 to 85 decibels (dB). In this context, instability may mean that, where multiple transistors are used in the input stage, the source-to-drain and/or source-to-body voltages of the transistors may not be identical due to manufacturing tolerances. A stable signal may result where the stages subsequent to the input stage are provided a source-to-drain or source-to-body voltage signal which is identical or substantially identical.

It should also be noted that transistor mismatching is especially severe for transistors with a thick gate oxide, such as with high-voltage rated transistors. High-voltage rated transistors are typically used to achieve high drain-source voltages during amplifier operation. Further, since in a typical differential amplifier, the drain-source voltage of the amplifier input pair may be as high as the supply voltage, the use of high-voltage thick-oxide transistors is required. In some instances, the differential amplifier may use a combination of low-voltage thin-oxide transistors and high-voltage thick-oxide transistors. In this case, the differential amplifier input stage must be configured to withstand the common-mode input voltage over the full supply voltage range. As was previously noted, however, the use of high-voltage transistors in the input stage determines the amplifier accuracy due to the transistor mismatch.

The low-voltage gain and errors in common-mode rejection are especially a problem in the design and operation of precision operational amplifiers. A precision operational amplifier is typically an amplifier with very high open loop gain and common mode/power supply rejection ratios, and very low offset voltage and offset current. Precision operational amplifiers are ideal for accurately amplifying signals, while introducing minimal error. Consequently, precision operational amplifiers are especially useful in applications, such as, for example, military, aviation, medical and space applications, requiring increased accuracy over other conventional amplifier designs.

Because of the critical environment in which precision operational amplifiers are used, a need exists for a precision operational amplifier wherein the rejection ratios of the amplifier are increased above amplifiers found in the prior art. It would be desirable for such a precision operational amplifier to include circuitry configured to account for effects on the amplifier offset voltage, and/or the instability of the source-to-drain, or source-to-body voltages, of the mismatched transistors.

SUMMARY OF THE INVENTION

The method and circuit according to various aspects described herein addresses many of the shortcomings of the prior art. In accordance with one aspect of the present invention, a precision operational amplifier is provided which uses CMOS transistors configured to stabilize the drain-to-source voltage of the transistors comprising the operational amplifier input stage. In one exemplary embodiment, an exemplary operational amplifier input stage uses a differential input pair of CMOS transistors, cascoded CMOS transistors, a voltage reference source, and an averaging circuit for detecting the average of the drain-to-source voltages of the CMOS input transistors. An amplifier is used to control the gate potential of the cascode CMOS transistors to aid in ensuring that the drain-to-source voltage of the input transistors is stabilized during operation. In one exemplary embodiment, the amplifier ensures that the drain-to-source voltage $V_{ds}$ remains substantially equal to the input transistor voltage reference source.

In accordance with another exemplary embodiment, an exemplary operational amplifier input stage includes a differential amplifier with cascoded transistors M3 and M4 configured in single voltage supply operation. In this context, single supply operation may include ensuring that at a common mode voltage of about zero volts, the gate voltages of the input transistors M1 and M2 are kept close to ground.

BRIEF DESCRIPTION OF DRAWINGS

A more complete understanding of the present invention may be derived by referring to the various exemplary embodiments which are described in conjunction with the appended drawing figures in which like numerals denote like elements, and in which.

DETAILED DESCRIPTION OF VARIOUS EXEMPLARY EMBODIMENTS

Figure 1:
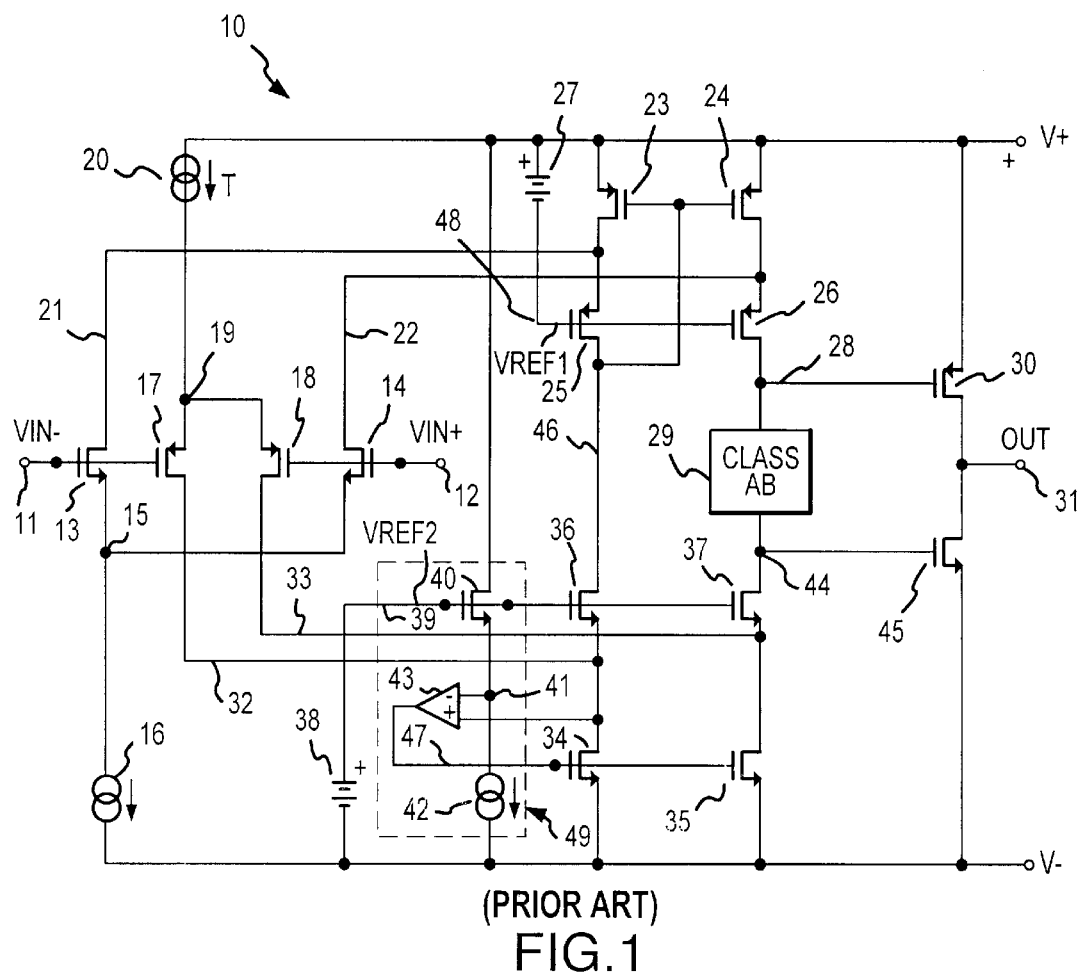
FIG. 1 is a schematic representation of a prior art embodiment of an operational amplifier input stage including a single input differential pair.

The various embodiments disclosed herein may be described in terms of various functional components and various processing steps and stages. It should be appreciated that such functional components may be realized by any number of hardware or structural components configured to perform the specified functions. For example, the various embodiments may employ integrated components comprised of various electrical devices, e.g., resistors, transistors, capacitors, diodes and the like, whose values may be suitably configured for various intended purposes. In addition, the various embodiments may be practiced in any integrated circuit application in which operational amplifiers are utilized. Such general applications that may be appreciated by those skilled in the art in light of the present disclosure are not described in detail herein. However, for purposes of illustration only, the various exemplary embodiments will be described herein in connection with precision operational amplifiers containing a differential input stage.

Further, it should also be appreciated that the particular implementations shown and described herein are illustrative examples of the various embodiments and are not intended to otherwise limit the scope of the disclosure in any way. Indeed, for the sake of brevity, conventional electronics, transistors, differential amplifiers and other functional aspects of the various embodiments (and components of the individual operating components of the various embodiments) may not be described in detail herein. Furthermore, the connecting lines shown in the various figures contained herein are intended to represent functional relationships and/or physical or logical couplings between the various elements. It should be noted that many alternative or additional functional relationships, physical connections or logical connections may be present in a practical differential amplifier construction, and as such, are contemplated to be within the scope of the embodiments described herein. Further still, it should be noted that while various components may be suitably coupled or connected to other components within the exemplary circuits described herein, such connections and couplings can be realized by direct connection between components, or by connection through other components and devices located therebetween. Moreover, no item or component is essential to the practice of the invention unless the element is specifically described as "essential" or "critical."

As discussed above, previous approaches for extending the operational range of the differential amplifiers over the common-mode input voltages involve, inter alia, using transistors which are mismatched. In this context, "mismatched transistors" are transistors having differing manufacturing results due to manufacturing tolerances used in the transistor fabrication process. As noted, using mismatched transistors may lead to a modified offset voltage. However, in accordance with various embodiments of the present invention, an operational amplifier is configured with an input stage having a cascoded differential input pair for stabilizing source-to-drain (or body-to-drain) voltage of the input stage. In accordance with a one exemplary embodiment a CMOS operational amplifier is disclosed using a single supply input.

In one example, the accuracy of the differential amplifier system may be improved above the prior art by ensuring that, while the drain-to-source voltages of the input transistors M1 and M2 are equal to the value of the voltage reference source, the gate potential of the cascoded transistors M3 and M4 is kept at a positive value when the input voltages are near zero. That is, the gate-to-source voltages of the cascoded transistors M3 and M4 may be maintained such that the gate-to-source voltages of the input transistors M1 and M2 may be greater than the gate-to-source voltages of the cascoded transistors M3 and M4 plus the value of the reference voltage. Alternatively stated, the gate-to-source voltage of the cascode transistors M3 and M4 may be less than the gate-to-source voltages of the input transistors M1 and M2 minus the reference voltage.

The relationship of the gate-to-source voltages of the input transistors M1 and M2 to the gate-to-source voltages of the cascoded transistors M3 and M4 and the reference voltage value may be expressed by the following equation:

$$V_{gsM3,M4} < V_{gsM1,M2} - V_{dsref} \quad (1)$$

where $V_{gsM1,M2}$ is the gate-to-source voltage of the input transistors M1 and M2, $V_{gsM3,M4}$ is the gate-to-source voltage of the cascode transistors M3 and M4, and $V_{dsref}$ is the voltage value of the reference voltage for the input transistors. As should be understood, in single supply operation where the common mode voltage is near the grounding pointing, when the drain-to-source voltage of the input transistors is substantially equivalent to the reference voltage, the $V_{th}$ of one of the CMOS transistors may be expressed as:

$$V_{th} = V_{tho} + \gamma(\sqrt{2\phi F - V_{bs}} - \sqrt{2\phi F}) \tag{2}$$

In accordance with equation (2) above, $V_{th}$ is the transistor voltage threshold, $V_{bs}$ is the body bias voltage for the transistor, $\gamma$ is the body bias coefficient, $V_{tho}$ is the zero body bias threshold, and $\phi$ is the transistor surface potential. Thus, the transistor voltage threshold $V_{th}$ and subsequently the gate-to-source voltage, of the cascode transistors M3 and M4 may well be controlled by body-biasing the cascode transistor's body during operation. The body biasing of the cascode transistors is achieved by providing a body biasing circuit including a voltage source for biasing the bodies of the cascode transistors. Further, where the gate-to-source voltages of the cascode transistors falls below a level sufficient to maintain the relationship defined in equation (1), then the bodies of the input transistors may be positively biased by an input transistor voltage reference source to increase the value of the gate-to-source voltages of the input transistors to reestablish the relationship defined. Further still, in accordance with an exemplary embodiment, the maximum value of the body biasing voltage source may be such that the value does not exceed any attendant base to emitter voltage $V_{be}$ of the transistor p-n junction to prevent operation of any parasitic bipolar structures in the CMOS transistors used.

Figure 2:
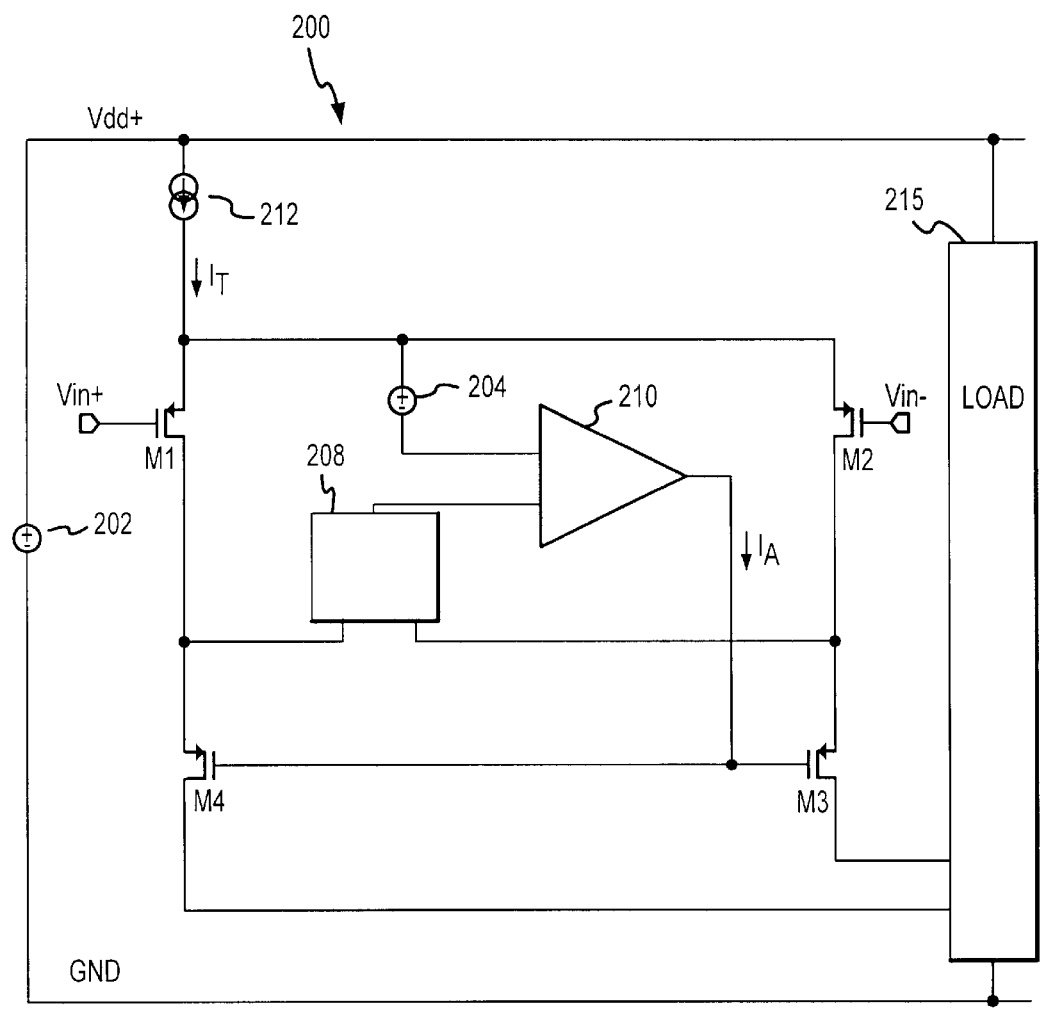
FIG. 2 is a block representation of an operational amplifier with an input stage including a cascoded transistor pair in accordance with an exemplary embodiment of the present invention.

In accordance with one exemplary embodiment, FIG. 2 shows a block diagram of a differential amplifier 200 with improved power supply and common mode rejection above that of the prior art. As described in greater detail below, amplifier 200 includes a voltage source 202 with positive node connected to a current source 212 and a load 215. The current source 212 may be further connected to the source nodes of differential input transistor pair M1 and M2, for providing a tail current $I_T$ to the source nodes of transistors M1 and M2. Further, the source nodes of input transistors M1 and M2 may be connected to the positive node of input transistor. reference voltage source 204, and the gates of transistors M1 and M2 may be connected to input voltages $V_{IN+}$ and $V_{IN-}$, respectively. Differential amplifier 200 further includes an amplifier 210 connected at the negative terminal of voltage source 204, and an averaging circuit 208 for averaging the drain voltages of input transistors M1 and M2. The drains of input transistors M1 and M2 are provided to the averaging circuit 208 which further provides the resulting averaged voltage to the amplifier 210.

Differential amplifier 200 may further include a cascoded transistor pair M3 and M4. Cascoded transistor pair M3 and M4 are configured such that the amplifier 210 may control the gate potential of the cascoded transistor pair M3 and M4. For example, in one exemplary embodiment, the output of amplifier 210 may be provided to the gates of the M3 and M4 transistors, for ensuring that the gates of the transistors are kept positive when the input voltages $V_{IN+}$ and $V_{IN-}$ are close to zero and the drain-to-source voltages of input transistors M1 and M2 are close to the value of voltage source 202.

Cascoded transistors M3 and M4 may be configured such that the drain nodes of transistors M3 and M4 may be connected to load 215 and the source nodes of transistors M3 and M4 may be connected to the drain nodes of input transistors M1 and M2.

Voltage source 202 may be any suitable source for providing a positive voltage ($V_{dd+}$) to differential amplifier 200. In particular, the voltages $V_{dd+}$ and a grounding potential, GND, may be used to define the common mode range of amplifier 200. That is, $V_{dd+}$ and GND may define the upper and lower voltage limits of operation of differential transistor pair 204. In single supply operation, lower rail voltage $V_{dd-}$ may be ground, as shown with respect to differential amplifier 200.

Current source 212 may be of any conventional construction for providing a constant current. For example, current source 212 may be any current source configured to provide sufficient current such that at least one of transistor pair M1 and M2 remains conductive. Typical current sources for use with differential operational amplifiers are well known in the art, and as such, will not be discussed in great detail herein.

Differential input transistor pair M1 and M2 may be any transistor pair capable of receiving input voltages $V_{IN+}$, and $V_{IN-}$ and providing an output current within the common mode range (e.g. differential input signal). Further, transistors M3 and M4 may be similar in description and operation as that of input transistor pair M1 and M2. Transistors which may be used with this exemplary embodiment include, for example, any conventional NMOS or PMOS transistors as are commonly found in any conventional differential amplifier circuit. Therefore, it should be understood that, while this exemplary embodiment is depicted using PMOS transistors, the invention is not so limited. That is, other exemplary embodiments of the present invention may be depicted using NMOS transistors, with minor alterations, such as for example, using complimentary NMOS transistors in much the same was as illustrated with the PMOS transistors discussed herein.

As noted, transistors M1, M2, M3, M4 may be PMOS transistors of PNP construction. In an exemplary embodiment, it may be preferred that the low-voltage threshold of the transistors M1, M2, M3, M4 may be of from about 0.2 to 1.0 volts with a transistor current of from about 200 mv.

As described above, differential voltages $V_{IN+}$ and $V_{IN-}$ may be configured such that the differential voltages may provide a voltage signal at the gates of transistors M1 and M2 for biasing those transistors. In particular, $V_{IN+}$ and $V_{IN-}$ may be of sufficient value for ensuring that transistors M1 and M2 may operate in the transistor active region.

Integrated amplifier 210 may be of any conventional amplifier construction capable of receiving a signal and providing an amplified signal. Averaging circuit 208 may be any circuit configuration capable of receiving at least a first and second input signal and providing an output signal representative of the average of the first and second input signals. In this context, the average may be any arithmetic, geometric, maximum, and or minimum, etc., of the signals input into the averaging circuit. However, it should be understood that any suitable averaging result may be used. Further, while FIG. 2 illustrates the averaging circuit 208 as encompassed within a single circuit structure, it should be understood that the averaging circuit 208 may comprise a single component or a number of individual components configured to provide an output signal representative of the average of the signals input into the circuit 208.

During operation, differential voltages $V_{IN+}$ and $V_{IN-}$ may be provided to input transistors M1 and M2 respectively as described above. Voltage source 202 may provide an upper rail voltage $V_{dd+}$ to current source 212. Current source 212 may provide a constant current to transistors M1 and M2. As noted, the current provided by current source 212 may be of any value for ensuring that at least one of the input transistors M1 and M2 operates in the transistor active region. Voltage source 204 provides a reference voltage for operation of the amplifier 210, and a reference voltage for the operation of input transistors M1 and M2. In the exemplary embodiment depicted, voltage source 204 may provide a negative voltage to the amplifier 210.

The drain voltages of input transistors M1 and M2 (and alternatively, the source voltages of cascode transistors M3 and M4) may be provided to averaging circuit 208, which may then provide to amplifier 210 an output representing the average of the input transistor M1 and M2 drain voltages. Amplifier 210 may then amplify the averaged output and provide the amplified averaged output to the gates of cascoded transistors M3 and M4.

As noted, due to manufacturing tolerances in the fabrication process, transistors M1 and M2 may not be identical. That is, transistors M1 and M2 may be mismatched. For example, the manufacturing tolerances may result in different channel lengths or surface area for the transistors. More particularly, transistor M1 and M2 may be mismatched in that transistor M1 may not have identical operation as transistor M2. Consequently, as the common mode voltage of the differential amplifier 200 changes, the drain-to-source voltage of the transistors M1 and M2 changes accordingly, but such change in the drain-to-source voltage of the transistor M1 may not be identical to the change in drain-to-source voltage of M2. That is, the change in the drain-to-source voltage for transistor M1 may not be identical to the change in the drain-to-source voltage of transistor M2 at any one time. Therefore, due to the mismatch in transistors M1 and M2, the offset voltages of the transistors are modified and the power supply rejection and the common mode rejection of a conventional operation amplifier designed with such transistor is limited to about 75–85 dB. Where the drain-to-source voltage of the transistors M1 and M2 may be stabilized, the power supply rejection and the common mode rejection of the amplifier may be improved. In one exemplary embodiment, the power supply rejection and the common mode rejection of the amplifier may be improved to about 110–120 dB.

As noted, transistors M3 and M4 may be cascoded transistors. The use of the cascoded transistors may increase the overall gain of the differential amplifier system. In an exemplary cascode arrangement, the gates of the cascoded transistors may share a common node, as shown in FIG. 2. In alternate embodiments described below, the cascoded transistors may not be connected in common gate configuration. Indeed separation of the gates may improve the overall operation of the input stage. For example, during small-signal operation of the amplifier, separation of the gates of the cascoded transistors may increase the output impedance at the drains of the cascoded transistors M3 and M4 and, the overall voltage gain of the amplifier first stage (e.g., input stage). For large-signal operation of the amplifier (e.g., slewing conditions), separation of the gates of the cascode transistors may provide more independent operation of the input transistors with faster and cleaner signal settling after signal slewing.

With respect to the cascode configuration of FIG. 2, in order to aid in ensuring proper operation of the cascoded transistors M3 and M4, the gates of transistors M3 and M4 may be biased by an identical biasing signal, such as for example, the biasing signal provided by the drain-to-source voltages of input transistors M1 and M2. However, as noted, the drain-to-source voltages of M1 and M2 may have differing values due to manufacturing tolerances. Consequently, where it is desired to bias the cascode transistors M3 and M4 with the drain-to-source voltages of M1 and M2, it may be desirable to stabilize the drain-to-source voltages of input transistors M1 and M2. In this context, stabilized means that the drain-to-source voltage of M1 and the drain-to-source voltage of M2 may appear to cascode transistors M3 and M4 as being equivalent or substantially equivalent. This, in turn, allows transistors M3 and M4 to be in proper cascode operation. The use of properly operating cascode transistors may improve the power supply rejection and common mode rejection of the amplifier system 200.

Stabilization of the input transistors M1 and M2 drain-to-source voltages may be achieved by averaging the drain-to-source voltages prior to providing the voltage signals to the cascode transistors M3 and M4. In accordance with an exemplary embodiment, the averaging circuit 208 may average the differing drain-to-source voltages of transistors M1 and M2 into a single stable voltage signal which may be provided to the gates of transistors M3 and M4 via amplifier 210. In this way, the signal provided by amplifier 210 may be used to control the gate potential of the transistors M3 and M4.

Figure 3:
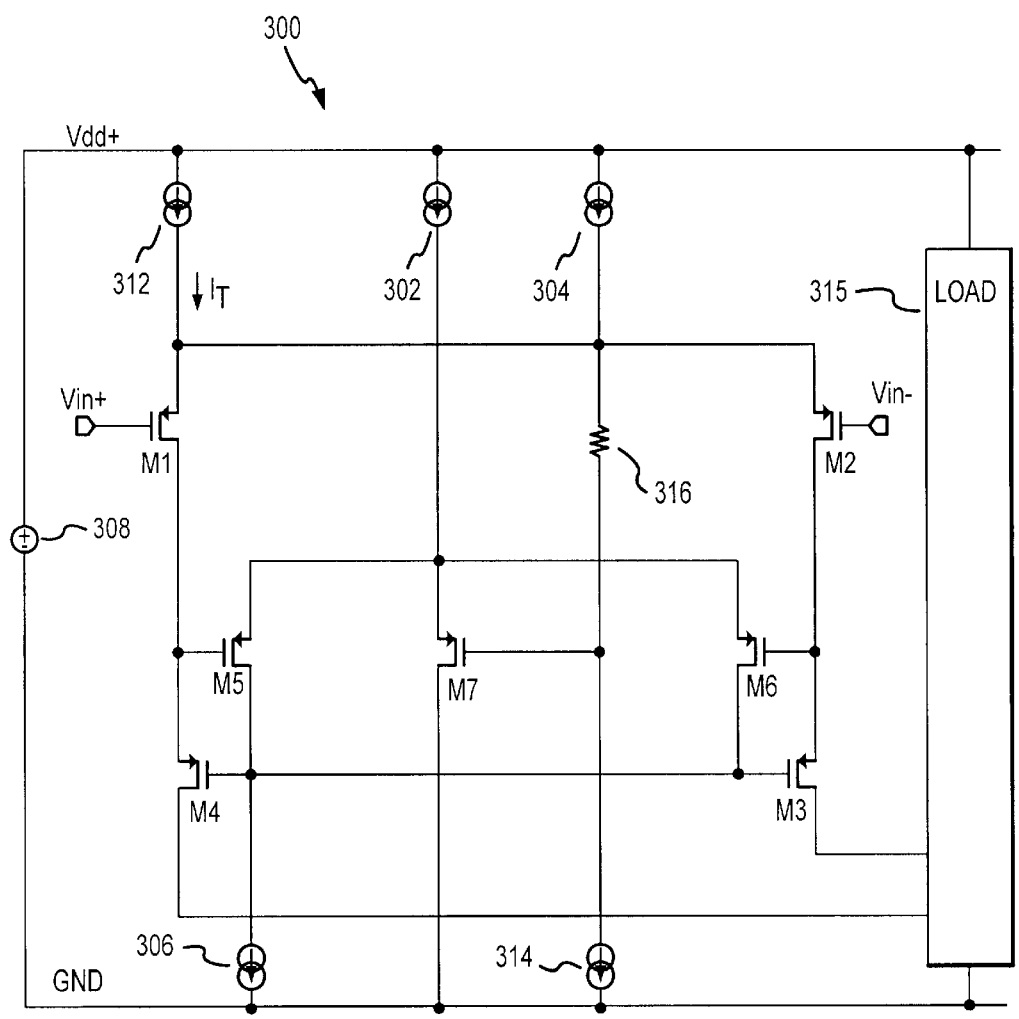
FIG. 3 is a schematic representation of an operational amplifier with an input stage including a cascoded transistor pair in accordance with another exemplary embodiment of the present invention.

FIG. 3 depicts another exemplary embodiment in accordance with the present invention wherein a differential amplifier system 300 includes a stabilized drain-to-source voltage of the input transistors M1 and M2. As shown, amplifier system 300 includes a voltage source 308, input transistors M1 and M2, transistors M5, M6, and M7, and cascoded transistors M3 and M4, wherein the transistors M1, M2, M3, and M4 are of similar description and operation as like elements of FIG. 2. Moreover, transistors M1 and M2 are connected to transistors M3 and M4, and the gates of transistors M3 and M4 share a common node, in similar fashion as was done with respect to FIG. 2. In addition, transistors M5, M6 and M7 may have similar description and operation as transistors M1, M2, M3, and M4.

Differential amplifier system 300 may further include current sources 302, 304, 306, 312, and 314, wherein the current sources of system 300 may have like description and operation as current source 212 of FIG. 2. Current source 312 may be connected to the positive node of voltage source 308 and to the source node of transistor M1. Similarly, current source 302 may be connected to the positive node of voltage source 308 and to the source node of transistor M7. Further still, current source 304 may be connected to the positive node of voltage source 308, to the gate of transistor M7, and to current source 314 via a resistor 316. Current source 314 may be further connected to the grounding potential, GND.

The gate of transistor M5 may be connected to the drain node of transistor M1 and to the source node of transistor M4. The drain of transistor M5 may be connected to the current source 306 and to the common node shared by the gates of transistors M3 and M4. Additionally, current source 306 may be further connected to ground potential, GND. The source nodes of transistors M5 and M6 may be connected to the source node of transistor M7, and the drain node of transistor M7 may be connected to the grounding potential. Further, the gate node of transistor M6 may be connected to the drain of transistor M2 and to the source of transistor M3, and the drain node of transistor M6 may be connected to the common node shared by the gates of transistors M3 and M4.

Differential amplifier 300 may be similar in operation as differential amplifier 200 of FIG. 2. In particular, transistors M1 and M2 may be provided a differential input voltage given by $V_{IN+}$ and $V_{IN-}$ for biasing transistors M1 and M2 during amplifier 300 operation. Taken in combination, transistors M5, M6 and M7, and current sources 302, 304, 306, 314 may operate to provides an amplified signal to the gates of transistors M3 and M4, correlative to the amplified average of the drain-to-source voltages of input transistors M1 and M2. More particularly, transistors M5, M6 and M7 are configured such that the drain-to-source voltage of transistor M1 may be provided to the gate of transistor M5 and the drain-to-source voltage of transistor M2 may be provided to the gate of transistor M6. In similar manner as with FIG. 2, the drain-to-source voltages of M1 and M2 may not be identical due to the manufacturing tolerances of the transistor fabrication process. Consequently, since transistors M5 and M6 are configured with differing drain-to-source voltages, transistors M5 and M6 may operate as a differential amplifier circuit, with current source 302 providing the tail current for the differential amplifier circuit given by transistors M5 and M6.

Stabilization of the drain-to-source voltages of transistors M1 and M2 may be accomplished by transistors M5 and M6. That is, as shown, transistors M5 and M6 perform a similar function as averaging circuit 208 of FIG. 2. In particular, the source voltages of transistors M5 and M6 may be defined as the arithmetic average of the drain-to-source voltages of transistors M1 and M2 when the gate voltages of the transistors M5 and M6 are at their maximum. Further, transistor M7 may be configured to ensure amplification of the resulting averaged drain-to-source voltage signal prior to providing the averaged drain-to-source voltage signal to the gates of transistors M3 and M4 for positively biasing those transistors. Further still, the voltage signal provided by current source 304 and resistor 316 provide the reference voltage for ensuring that transistor M7 may remain active during the amplification process.

Figure 4:
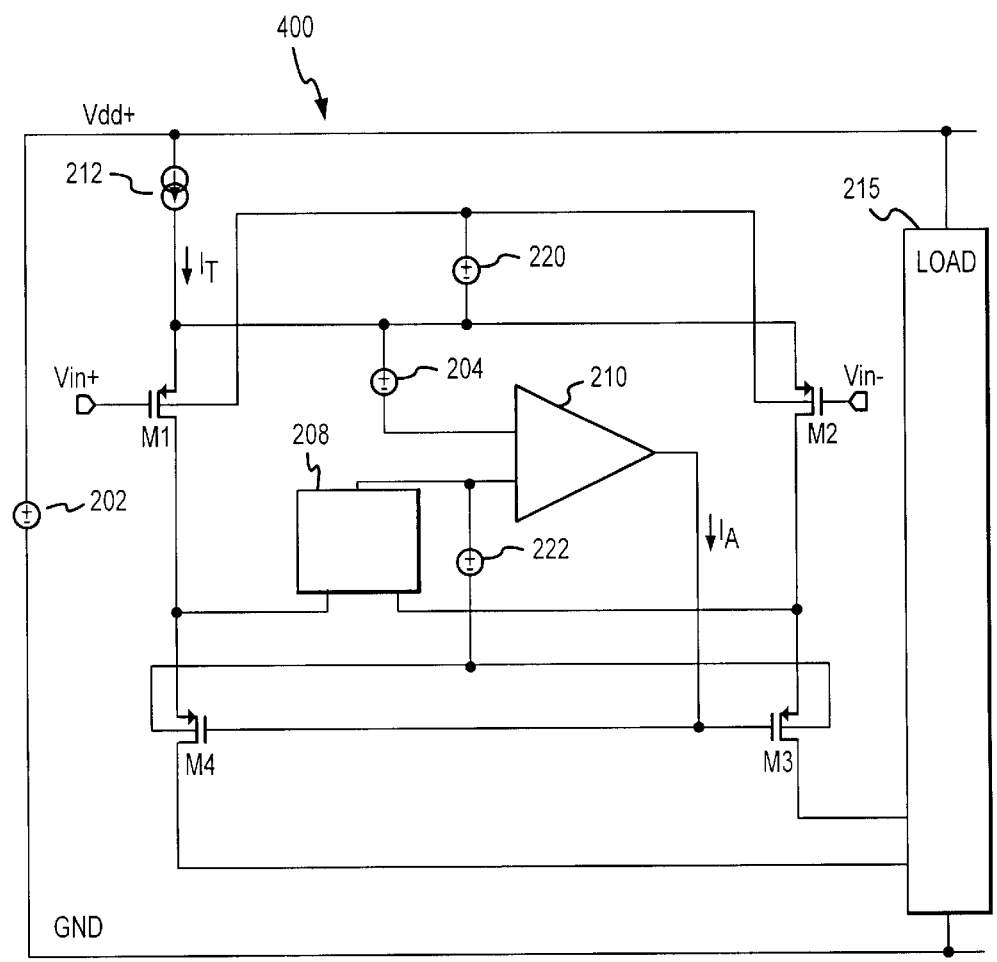
FIG. 4 is a block representation of an operational amplifier with an input stage and single supply operation including a cascoded transistor pair in accordance with another exemplary embodiment of the present invention.

FIG. 4 depicts yet another differential amplifier system 400 in accordance with still another exemplary embodiment of the present invention, wherein the amplifier system 400 is configured for single supply operation. In this context, single supply operation means that, during amplifier 400 operation, the common mode voltage of the amplifier may be zero and the differential reference voltage provided to the input transistor pair M1 and M2 may be close to ground. As shown, differential amplifier system 400 is similar in structure to amplifier 200 of FIG. 2. More particularly, amplifier system 400 includes voltage sources 202, 204, 220 and 222, current source 212, amplifier circuit 210, averaging circuit 208, and input transistors M1 and M2, which are connected in similar fashion as, and have similar description as, like elements of FIG. 2. Consequently, similar to FIG. 2, differential amplifier 400 may stabilize the drain-to-source voltage of input transistors M1 and M2 prior to providing the stabilized drain-to-source voltage to the gates of transistors M3 and M4.

It should be noted, however, that to ensure proper operation of amplifier system 400 in single supply operation mode, the gate potential of transistors M3 and M4 may be positive, when the value of $V_{IN+}$ and $V_{IN-}$ are near zero while the drain-to-source voltage of M1 and M2 are substantially equal to the reference voltage provided by voltage source 204. To ensure that the gate potential of the transistors M3 and M4 remain positive during operation of the amplifier 400, the bodies of transistors M1 and M2 are biased by a voltage source 220, and the bodies of transistors M3 and M4 are body biased with a voltage source 222, as described more fully below.

As previously noted, the relationship of the gate-to-source voltages of the input and cascode transistors and the reference voltage provided by 204 may be given by equation (1) noted above. Further, since the gate-to-source voltage of a transistor may be given by equation (2) above where the drain-to-source voltage of transistors M1 and M2 is substantially equivalent to the voltage provided by voltage source 204, it can be readily seen that the gate-to-source voltage $V_{gsM1, M2}$ of the input transistors M1 and M2, and the gate-to-source voltages $V_{gsM3, M4}$ of cascode transistors M3 and M4 may be controlled by body biasing the transistors during operation. As previously noted, body biasing of the input transistors M1 and M2 is done by voltage source 220. Similarly, body biasing of the cascode transistors M3 and M4 may be done by voltage source 222. Thus, in accordance with equation (1), in order to ensure that the gate-to-source voltage of cascode transistors remains positive for single supply operation, the bodies of transistors M1 and M2 may be positively biased by voltage source 220, when the decrease in the gate-to-source voltage of transistors M3 and M4 results in the relationship expressed in equation (1) not being adhered to.

The operation of differential amplifier 400 may be further understood with reference to the following illustrative example in which transistors M1, M2, M3, and M4 are of the low-$V_{th}$ type with $V_{th0}$=0.8V volts, zero body bias voltage, $V_{bs}$, body-bias coefficient, $\gamma \approx 0.5$, and surface potential $\phi \approx 0.35$ volts. Further, although the rail-to-rail common mode range of amplifier system 400 can accommodate a variety of ranges, the following discussion of the operation of amplifier system 200 is based on a supply voltage of 0.9 volts for illustrative purposes only.

Using equation (1) and the above noted transistor parameters, it can be seen that where the common-mode voltage is near zero, $V_{CM} \approx 0$, the bodies of transistors M1 and M2 may be positively biased by the positive node of voltage source 220. Similarly, the bodies of transistors M3 and M4 may be negatively biased by the negative node of voltage source 222. That is, as the common mode voltage provided by voltage source 202 approaches ground (e.g., $V_{CM} \approx 0$), the gate-to-source voltages of input transistors M1 and M2 may also approach ground, which in turn may send the gate-to-source voltage of the cascode transistors M3 and M4 to zero. However, as stated, to aid in the proper operation of the cascode transistors, the gates of the cascode transistors may be positively biased by the output signal provided by amplifier 210. Thus, as the drain-to-source voltages of transistors M1 and M2 approach zero, the body-to-source voltage of the input transistors may be biased by the negative node of reference voltage source 220. By biasing the input transistors accordingly, the drain-to-source voltage of the input transistors may be made substantially equivalent to the value of voltage reference source 220. Further, where the input transistors are thusly biased, the gate-to-source voltage of cascode transistors M3 and M4 may be permitted to remain positive. Further still, the positive gate-to-source voltage of cascode transistors M3 and M4 may be aided by the body biasing of the cascode transistors by the negative voltage node of voltage source 222.

Figure 5:
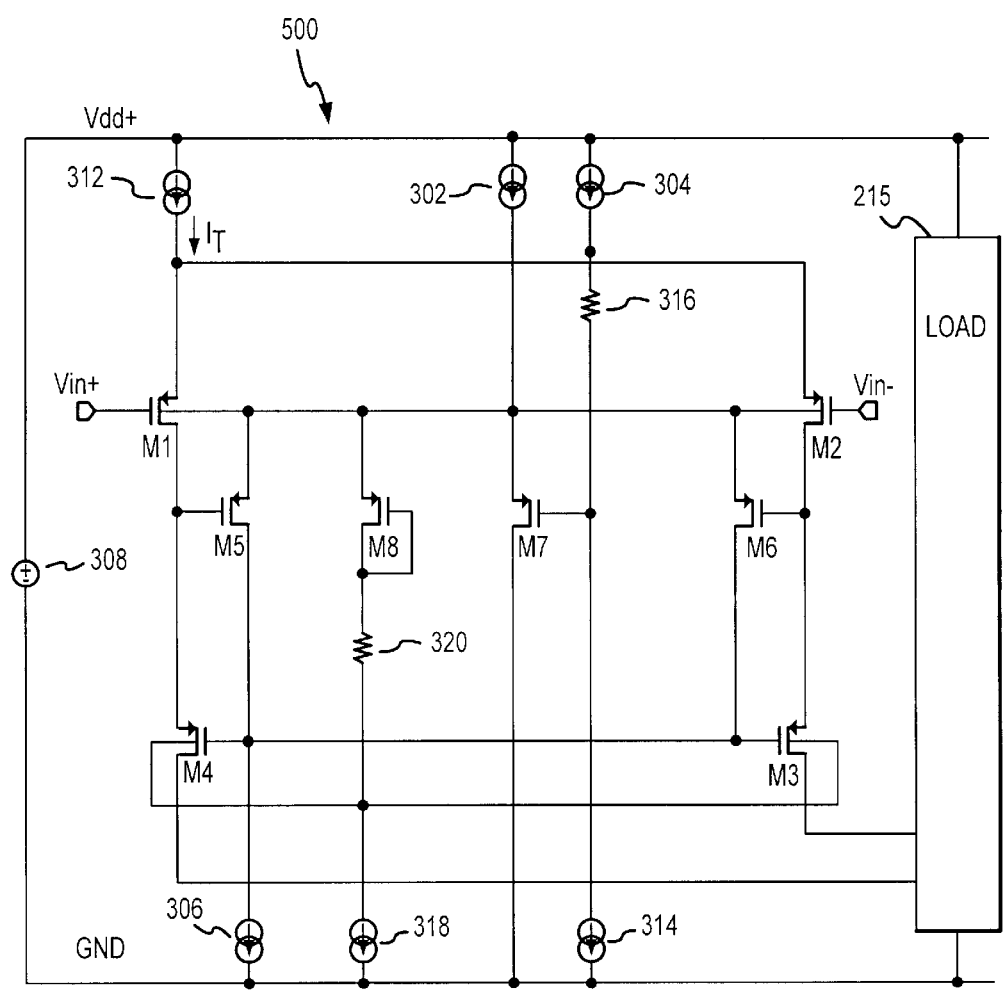
FIG. 5 is a schematic representation of an operational amplifier with an input stage and single supply operation including a cascoded transistor pair in accordance with another exemplary embodiment of the present invention.

FIG. 5 depicts yet another exemplary embodiment of an amplifier 500 in accordance with the present invention. Differential amplifier 500 includes current sources 302, 304, 306, 312, 314 and 318, wherein the current sources of system 500 have like description and operation as current source 212 of FIG. 2. Current source 312 may be connected to the positive node of voltage source 308 and to the source node of transistor M1. Similarly, current source 302 may be connected to the positive node of voltage source 308 and to the source node of transistor M7. Further still, current source 304 may be connected to the positive node of voltage source 308, to the gate of transistor M7, and to current source 314 via a resistor 316. Current source 314 may be further connected to the grounding potential, GND.

As described more fully below, differential amplifier 500 operates in much the same fashion as amplifier system 400 of FIG. 4. Amplifier system 500 includes a voltage source 308, input transistors M1 and M2, transistors M5, M6, M7, and M8, and cascoded transistors M3 and M4, wherein the transistors M1, M2, M3, M4, M5, M6, M7, and M8 are of similar description and operation as transistors M1 and M2 of FIG. 2. Moreover, the source nodes of transistors M3 and M4 may be connected to the drains of transistor M2 and M1, respectively, and the gates of transistors M3 and M4 share a common node, in similar fashion as was done with respect to FIG. 2.

In addition, transistors M1 and M2, and M3 and M4, may be configured such that the transistors may be body biased during circuit operation. In particular, the body node of transistor M1 maybe connected to the body node of transistor M2, and the body node of transistor M3 maybe connected to the body node of transistor M4.

The voltage source for biasing the bodies of transistors M1 and M2 may be formed by connecting to the source nodes of transistors M5 and M6 to the most positive potential in the amplifier 500. As shown, the gate of transistor M5 may be connected to the drain of transistor M1 and the source of transistor M4. The source node of transistor M5 may be connected to the bodies of transistors M1 and M2, and the drain of transistor M5 may be connected to the gates of transistors M3 and M4 and to a current source 306, which may be further connected to the grounding potential. Similarly, the gate of transistor M6 may be connected to the drain of transistor M2 and the source of transistor M3. The source node of transistor M6 may be connected to the bodies of transistors M1 and M2, and the drain of transistor M6 may be connected to the gates of transistors M3 and M4.

The voltage source for use in biasing the bodies of transistors M3 and M4 may be formed by providing a current source 318, which may be connected to a resistor 320 and to the grounding potential, GND. The resistor 320 may be further connected to the drain of a transistor M8 which may be configured as a current mirror. Transistor M8 is configured such that the source of transistor M8 is connected to the bodies of transistors M1 and M2, and the gate and source nodes of transistor M8 share a common node which may be further connected to the resistor 320. Consequently, the bodies of transistors M3 and M4 may be biased by the voltage drop across resistor 320, wherein the value of the voltage drop may be given by the resistor 320 value times the value of the current produced by the current source 318. (e.g. voltage drop$_{320}$=current source 318 value [×] resistor 320 value).

Differential amplifier 500 may be similar in operation as differential amplifier 200 of FIG. 2. In particular, transistors M1 and M2 may be provided a differential input voltage given by $V_{IN+}$ and $V_{IN-}$ for biasing transistors M1 and M2 during amplifier 500 operation. Taken in combination, transistors M5, M6 and M7, and current sources 302, 304, 306, 314 operate to provide to the gates of transistors M3 and M4 an amplified signal correlative to the average of the drain-to-source voltages of input transistors M1 and M2. More particularly, transistors M5, M6 and M7 are configured such that the drain-to-source voltage of M1 may be provided to the gate of transistor M5 and to the gate of transistor M6. In similar manner as was described with respect to FIG. 2, the drain-to-source voltages of M1 and M2 may not be identical due to the manufacturing tolerance of the transistor fabrication process. Consequently, since transistors M6 and M7 are provided differing drain-to-source voltages, transistors M5 and M6 may operate as a differential amplifier circuit, with current source 302 providing the tail current for the differential amplifier circuit given by transistors M5 and M6.

Stabilization of the drain-to-source voltages of M1 and M2 may be accomplished by transistors M5 and M6. That is, as shown, transistors M5 and M6 perform a similar function as averaging circuit 208 of FIG. 2. In particular, the drain-to-source voltages of transistors M5 and M6 may be the arithmetic average of the gate-to-source voltages of the transistors M1 and M2. Alternatively, the drain-to-source voltages of transistors M5 and M6 may be the greater of the gate-to-source voltages of M1 and M2. Further, transistor M7 is configured to ensure amplification of the resulting averaged drain-to-source signal prior to providing the averaged drain-to-source voltage to the gates of transistors M3 and M4 for positively biasing those transistors. Further still, the voltage signal provided by current source 304 and resistor 316 may provide the reference voltage for ensuring that transistor M7 remains active during the amplification process.

Figure 6:
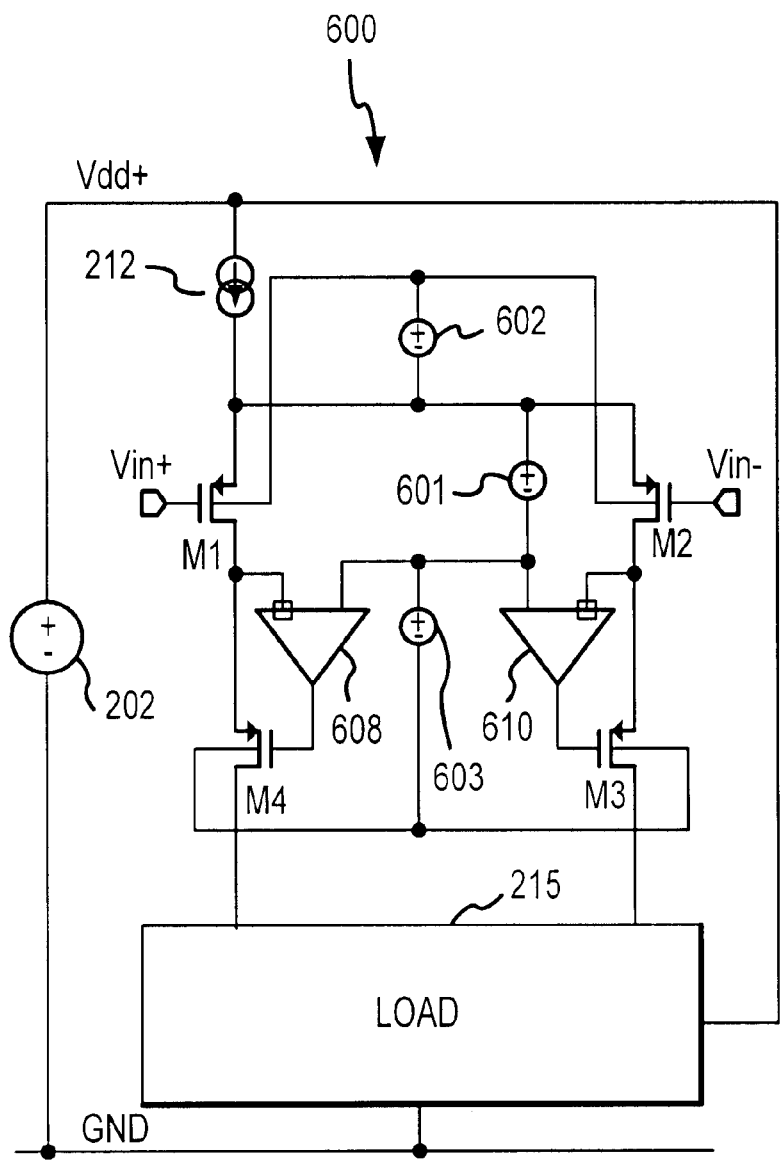
FIG. 6 is a schematic representation of an operational amplifier with an input stage and single supply operation in accordance with another exemplary embodiment of the present invention.

FIG. 6 depicts yet another differential amplifier system 600 in accordance with still another exemplary embodiment of the present invention. Differential amplifier 600 includes a voltage source 202, reference voltages, 601, 602, and 603, current source 212, amplifiers 608 and 610, input transistors M1 and M2, and cascoded transistors M3 and M4, wherein each element of amplifier 600 has like description and operation of similar elements of amplifier 400. Input transistors M1 and M2 are connected in differential amplifier 600 in much the same way as like transistors in FIG. 4. In particular, transistors M1 and M2 may be provided input voltages $V_{IN-}$ and $V_{IN+}$ respectively, and transistor M1 may be further connected to current source 212. Current source 212 may be further connected to positive voltage rail $V_{dd+}$, provided by voltage source 202. Positive voltage rail $V_{dd+}$ may be further connected to load 215, and load 215 may be further connected to the low-voltage rail, or ground.

The body of transistor M1 may be further connected to the body of transistor M2 such that the transistors M1 and M2 may share a common node. Similarly, the source nodes of transistors M1 and M2 may be connected such that the source nodes of the transistors M1 and M2 may share a common node. Interposed between the common nodes shared by transistors M1 and M2 may be a voltage reference source 602, configured such that the positive terminal of voltage source 602 may be connected to the body nodes of transistors M1 and M2. The negative terminal of voltage source 602 may be connected to the source nodes of transistors M1 and M2.

The drain node of transistor M1 may be connected to the source node of transistor M4 and to an amplifier 608. Likewise, the drain node of transistor M2 may be connected to the source node of transistor M4 and to an amplifier 610. In addition, amplifier 608 and amplifier 610 may be connected at (e.g., share) a common node, which may be further connected to the negative terminal of a voltage source 601. Further, voltage source 601 may be connected to the common node shared by the source nodes of transistors M1 and M2.

The drain nodes of cascoded transistors M3 and M4 may be connected to load 215. The gate node of transistor M4 may be connected to the output of amplifier 608, and the gate node of transistor M3 may be connected to the output of amplifier 610. In addition, the body nodes of transistor M4 and M3 may also share a common node which may be further connected to the negative terminal of a voltage source 603, and the positive terminal of voltage source 603 may be further connected to the common node shared by amplifiers 608 and 610.

In operation, current source 212 may provide a constant current to the source nodes of transistors M1 and M2, and input voltages $V_{IN-}$ and $V_{IN+}$ may provide a differential voltage signal to the gates of transistors M1 and M2, respectively. Transistors M1 and M2 may be body biased by the positive terminal of voltage source 602, measured relative to the source nodes of the transistors M1 and M2.

The drain-to-source voltage of transistor M1 may be provided to amplifier 608 and to the source node of transistor M4. Similarly, the drain-to-source voltage of transistor M2 may be provided to amplifier 610 and to the source node of transistor M3. Amplifier 608 and amplifier 610 may be further provided a reference voltage from the positive terminal of voltage source 603, or alternatively, may be provided a negative reference voltage from the negative terminal of voltage source 601. The amplifiers 608 and 610 may amplify the drain-to-source voltages of transistors M1 and M2, respectively, prior to providing the amplified drain-to-source voltages to the gates of cascode transistors M4 and M3. That is, the amplified drain-to-source voltage of transistor M1 provided by amplifier 608 may be provided to the gate of transistor M4, and the amplified drain-to-source voltage of transistor M2 may be provided to the gate of transistor M3 for biasing the cascoded transistors M3 and M4 during operation. Further, the body nodes of cascoded transistors M3 and M4 may be biased by the negative node of voltage source 603.

As noted, in accordance with equation (1) above, the voltage thresholds $V_{th}$ of cascode transistors M3 and M4 maybe controlled by controlling the body bias voltage $V_{bs}$ of those transistors. Thus, where cascode transistors M3 and M4 include similar body bias coefficients γ, zero body bias thresholds $V_{tho}$, and surface potential φ, by providing the cascode transistors M3 and M4 with a substantially identical body bias voltage $V_{bs}$, the thresholds of the transistors may be made substantially the same. That is, the voltage threshold of transistor M3 may be made substantially identical to the voltage threshold of transistor M4. This, in turn, may aid in ensuring that where the drain-to-source voltages of transistors M1 and M2 are mismatched due to manufacturing tolerances, the cascode transistors M3 and M4 may provide drain voltage signals to load 215, which are substantially identical. In particular, the mismatched drain-to-source voltages may be amplified by amplifiers 608 and 610 prior to being used to bias the gates of transistors M3 and M4. The voltage thresholds of cascoded transistors M3 and M4 may be made substantially identical by the body biasing affect of the negative terminal of voltage source 603, such that the drain-to-source voltages provided to the load 215 is stabilized.

Figure 7:
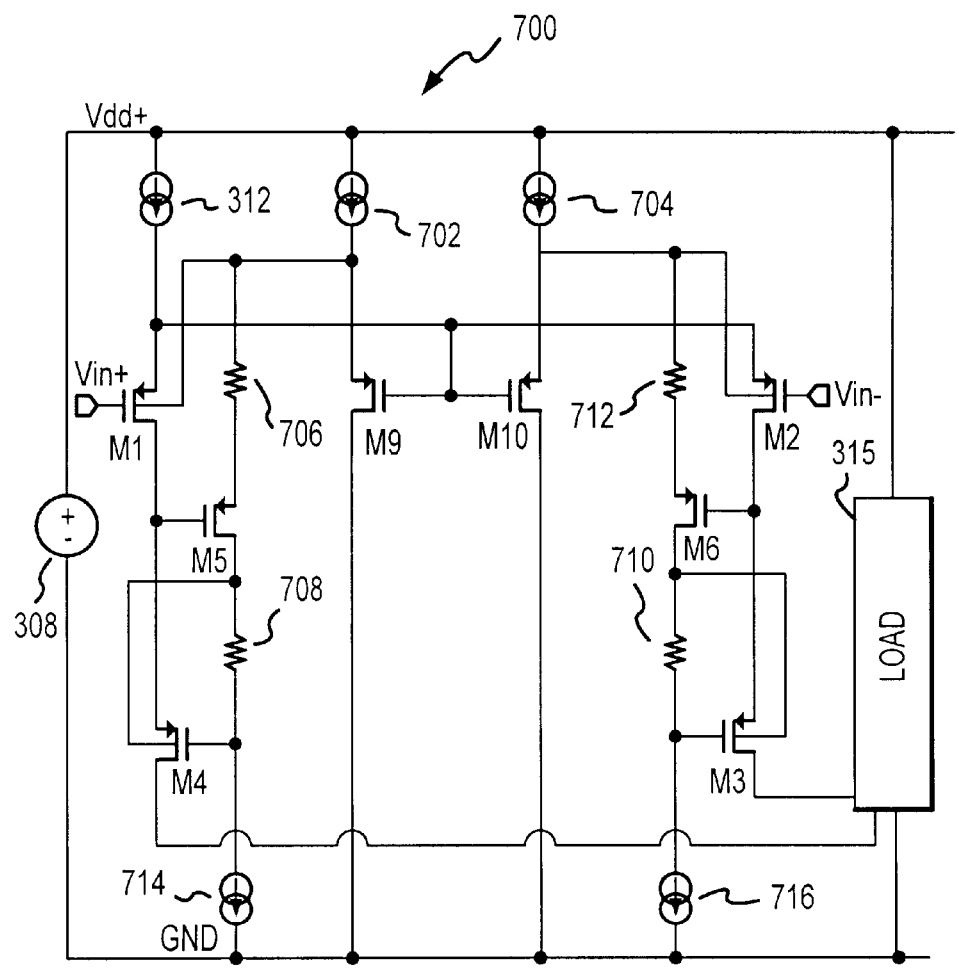
FIG. 7 is a schematic representation of an operational amplifier with an input stage and single supply operation in accordance with another exemplary embodiment of the present invention.

FIG. 7 depicts yet another exemplary embodiment of a differential amplifier 700 in accordance with the present invention. Differential amplifier may include current sources 312, 702, 704, 708, and 710, voltage source 308, input transistors M1 and M2, and transistors M3, M4, M5, and M6, wherein each element has similar description and operation as like elements of FIGS. 1–6. Further, the operation of differential amplifier 700 may have similar operation as amplifier 600 of FIG. 6, as discussed more fully below.

As shown, current source 312 may be connected to the source of transistor M1 and to the positive voltage rail $V_{dd+}$ provided by the positive terminal of voltage source 308. The positive rail $V_{dd+}$ may be further connected to current sources 702 and 704, and to load 315. The source nodes of transistors M1 and M2 may be connected such that the sources share a common node. Connected to the common node shared by transistors M1 and M2 may be the gates of transistors M9 and M10. Current source 702 may be connected to the source node of transistor M9, the body node of transistor M1, and to a resistor 706. In similar manner, current source 704 may be connected to the source node of transistor M10, the body node of transistor M2 and to a resistor 712. Further, the drains of transistor M9 and M10 may be connected to the low-voltage rail (e.g. ground).

Resistor 706 may be further connected to the source node of transistor M5, and the gate of transistor M5 may be connected to the source of transistor M4. The drain of transistor M5 may be connected to a resistor 708 and to the body node of transistor M4. Further, resistor 708 may be connected to the gate of transistor M4 and to current source 714, which may be further connected to ground.

Similarly, resistor 712 may be further connected to the source node of transistor M6, and the gate of transistor M6 may be connected to the drain of transistor M2. The drain of transistor M6 may be connected to a resistor 710 and to the body node of transistor M3. Further, resistor 710 may be connected to the gate of transistor M3 and to current source 716, which may be further connected to ground. Further still, the drains of transistors M3 and M4 may be connected to load 315.

During operation, voltage source $V_{dd+}$ may provide a positive voltage to current sources 312, 702, and 704, and to load 315. Input voltages $V_{IN-}$ and $V_{IN+}$ may provide a differential voltage to transistors M1 and M2, respectively. Current source 312 may provide a current signal to the source of transistor M1, which may be body biased by the voltage created by current source 702 and resistor 714. Similarly, current source 704 may provide a current signal to the source node of transistor M10 and transistor M2 may be body biased by the voltage created by current source 704 and resistor 712. Further, the gate of transistor M4 may be biased by the voltage created by current source 714 and resistor 708, and the gate of transistor M3 may be biased by the voltage created by current source 716 and resistor 710.

As previously noted, the drain-to-source voltages of transistors M1 and M2 may be mismatched due to manufacturing tolerances, such that the drain-to-source voltage provided by transistor M1 to transistor M4 may not be identical to the drain-to-source voltage provide by transistor M2 to transistor M3. In accordance with an exemplary embodiment, however, the gate of transistor M5 may be biased by the drain-to-source voltage provided by transistor M1, and the gate of transistor M6 may be biased by the drain-to-source voltage provided by transistor M2. In particular, transistor M5 may be configured such that transistor M5 matches transistor M9. That is, the voltage at the gate of transistor M5 (e.g. the voltage at the drain of transistor M1) may be equivalent, or substantially equivalent, to the voltage at the gate of transistor M9 plus the voltage drop across resistor 706, where the voltage drop across resistor 706 may be equal to resistor 706 value times the value of current source 714 (e.g., voltage drop$_{706}$= (resistor 706[×]current source 714 value). In this way, the drain-to-source voltage of M1 may be stabilized, and may further be equal to the value of current source 714 multiplied by the value of resistor 706.

Similarly, transistor M6 may be configured such that transistor M6 matches transistor M10. That is, the voltage at the gate of transistor M6 (e.g. the voltage at the drain of transistor M2) may be equivalent, or substantially equivalent, to the voltage at the gate of transistor M10 plus the voltage drop across resistor 712, where the voltage drop across resistor 712 may be equal to resistor 712 value times the value of current source 716 (e.g., voltage drop$_{712}$= resistor 712 value [×]current source 716 value). In this way, the drain-to-source voltage of M2 may be stabilized, and may further be equal to the value of current source 716 multiplied by the value of resistor 712.

The present invention has been described above with reference to various exemplary embodiments. However, it should be understood that changes and modifications may be made to the exemplary embodiments without departing from the scope of the present disclosure. For example, the various components may be implemented in alternate ways, such as, for example, by providing additional or fewer current mirrors, or additional amplifier stages. Further, the precision operational amplifier disclosed herein can also include additional elements which may be necessary for the operation of the amplifier, or include various different components of like operation as those described herein. For example, a negative and/or a positive supply regulator may be included and suitably configured to limit, filter or otherwise regulate the internal supply rails. In addition, for embodiments including various current mirrors, the devices can be configured to operate at various frequencies and other operating parameters. It should be understood that the configuration of the differential amplifier (e.g., transistors), implemented may be suitably selected depending upon the particular application or in consideration of any number of factors associated with the operation of the system. (e.g., the supply voltage, the output voltage, output current, requirements of the receiving load or process). Moreover, these and other changes or modifications are intended to be included within the scope of the present invention, as expressed in the following claims.

What is claimed is:

1. A single supply operational amplifier for amplifying a voltage difference between a pair of differential inputs, the amplifier comprising:
    a voltage source for providing a single voltage input for single supply operation;
    a first current source for receiving said single voltage input and providing a tail current;
    a differential transistor pair comprising at least a first and second transistor for receiving said tail current, said differential transistor pair configured to provide at least one of a first drain-to-source voltage, a first gate-to-source voltage, a second drain-to-source voltage and a second gate-to-source voltage;
    a signal averaging circuit for receiving said first and second drain-to-source voltages and providing an averaged signal;
    an integrated amplifier for receiving said averaged signal and providing an amplified average signal;
    a pair of cascoded transistors comprising at least a third and fourth cascoded transistor pair for receiving said amplified average signal, and
    a reference voltage source, said reference voltage source characterized by at least a positive voltage node,
    wherein said first transistor comprises a first CMOS transistor and said second transistor comprises a second CMOS transistor, said first CMOS transistor and second CMOS transistor characterized by a source node, a gate node, a drain node and a body node, and wherein said reference voltage source positive node is connected to said first CMOS transistor source node and said second CMOS transistor source node.

2. An amplifier according to claim 1, wherein said third transistor comprises a third CMOS transistor and said fourth transistor comprises a fourth CMOS transistor, said fourth CMOS transistor and third CMOS transistor characterized by a source node, a gate node, a drain node and a body node.

3. An amplifier according to claim 1, wherein said first CMOS transistor source node is connected to said second CMOS transistor source node.

4. An amplifier according to claim 3, wherein at least one of said first CMOS transistor and said second CMOS transistor receives said tail current at least one of said first CMOS transistor source node and said second CMOS transistor source node.

5. An amplifier according to claim 4, wherein at least one of said third CMOS transistor and said fourth CMOS transistor receives said averaged signal of at least one of said first CMOS transistor gate node and said second CMOS transistor gate node, said averaged signal for biasing at least one of said third CMOS transistor and said fourth CMOS transistor.

6. An amplifier according to claim 1, wherein said integrated amplifier comprises a differential amplifier.

7. An amplifier according to claim 1, wherein said first CMOS transistor body node is connected to said second CMOS transistor body node.

8. An amplifier according to claim 7, wherein said third CMOS transistor body node is connected to said fourth CMOS transistor body node.

9. An amplifier according to claim 8, further including a second reference voltage source, said second reference voltage source characterized by at least a second reference voltage source positive node for providing a second reference voltage source positive voltage and a second reference voltage source negative node for providing a second reference voltage source negative voltage.

10. An amplifier according to claim 9, wherein said second reference voltage source positive voltage is provided to at least one of said first CMOS transistor body node and said second CMOS transistor body node for body biasing at least one of said first CMOS transistor and said second CMOS transistor.

11. An amplifier according to claim 10, further including a third reference voltage source, said third reference voltage source characterized by at least a third reference voltage source positive node for providing a third reference voltage source positive voltage and a third reference voltage source negative node for providing a third reference voltage source negative voltage.

12. An amplifier according to claim 11, wherein said third reference voltage source negative voltage is provided to at least one of said third CMOS transistor body node and said fourth CMOS transistor body node for body biasing at least one of said third CMOS transistor and said fourth CMOS transistor.

13. An amplifier according to claim 12, wherein said first CMOS transistor, said second CMOS transistor are biased for ensuring that the third CMOS transistor gate-to-source voltage and the fourth CMOS transistor gate-to-source voltage remain positive.

14. A method for providing an operational amplifier with single supply operation, the method comprising the steps of:
    providing a CMOS differential input transistor pair, the differential input transistor pair including a first CMOS transistor and second CMOS transistor, the first CMOS transistor characterized by at least a first CMOS drain-to-source voltage and a first CMOS gate-to-source voltage, the first CMOS transistor configured to provide at least one of the first CMOS drain-to-source voltage and the first CMOS gate-to-source voltage, the second CMOS transistor characterized by at least a second CMOS drain-to-source voltage and a second CMOS gate-to-source voltage, the second CMOS transistor configured to provide at least one of the second CMOS drain-to-source voltage and the second CMOS gate-to-source voltage;

providing a CMOS cascoded transistor pair, the CMOS cascoded transistor pair including a first CMOS cascode transistor and second CMOS cascode transistor, the first CMOS cascode transistor characterized by a first CMOS cascode gate-to-source voltage, the first CMOS cascode transistor configured to provide the first CMOS cascode gate-to-source voltage, the second CMOS cascode transistor characterized by a second CMOS cascode gate-to-source voltage, the second CMOS cascode transistor configured to provide the second CMOS cascode gate-to-source voltage;

providing an averaging circuit, the averaging circuit configured to receive the first and second CMOS drain-to-source voltages and provide an average signal representative of the average between the first and second CMOS drain-to-source voltage;

biasing the first CMOS cascode transistor and the second CMOS cascode transistor in accordance with at least one of the first CMOS gate-to-source voltage and the second CMOS gate-to-source voltage; and body biasing at least one of the CMOS differential input transistor pair and the CMOS cascoded transistor pair in accordance with the value of at least one the first CMOS cascode transistor gate-to-source voltage and the second CMOS cascode transistor gate-to-source voltage.

15. A method for providing an operational amplifier with single supply operation, the method comprising the steps of:

providing a first CMOS drain-to-source voltage to an averaging circuit;

providing a second CMOS drain-to-source voltage to the averaging circuit;

averaging the first CMOS drain-to-source voltage and the second CMOS drain-to-source voltage into an average signal;

biasing a gate node of a first CMOS cascode transistor, and a gate node of a second CMOS cascode transistor with the average signal, where the gate node of the first CMOS cascode transistor shares a common node with the gate node of the second CMOS cascode transistor, and body biasing at least one of a CMOS differential input transistor pair, a CMOS cascoded transistor pair, the first CMOS cascode transistor and the second CMOS cascode transistor.

* * * * *